(12) United States Patent
Schulze et al.

(10) Patent No.: US 7,812,368 B2
(45) Date of Patent: Oct. 12, 2010

(54) HIGH SPEED DIODE

(75) Inventors: Hans-Joachim Schulze, Ottobrunn (DE); Franz-Josef Niedernostheide, Muenster (DE); Reiner Barthelmess, Soest (DE)

(73) Assignee: Infineon Technologies AG, Munich (DE)

( * ) Notice: Subject to any disclaimer, the term of this patent is extended or adjusted under 35 U.S.C. 154(b) by 871 days.

(21) Appl. No.: 11/419,919

(22) Filed: May 23, 2006

(65) Prior Publication Data

US 2007/0029634 A1   Feb. 8, 2007

(30) Foreign Application Priority Data

Mar. 24, 2005   (DE) .................. 10 2005 023 882

(51) Int. Cl.
   *H01L 29/74*   (2006.01)
(52) U.S. Cl. .................. 257/131; 257/401; 257/482; 438/140
(58) Field of Classification Search .............. 257/493, 257/127, 170, 409, 490, 31
   See application file for complete search history.

(56) References Cited

U.S. PATENT DOCUMENTS 5,032,540 A * 7/1991 Follegot .................. 438/543

5,101,244 A   3/1992 Mori et al. .................. 357/15
6,455,911 B1 * 9/2002 Stephani et al. .............. 257/493

FOREIGN PATENT DOCUMENTS

| DE | 4310444 A1 | 10/1994 |
| DE | 10316222 B3 | 1/2005 |
| EP | 0450306 B1 | 2/1991 |
| EP | 0878849 A2 | 11/1998 |

OTHER PUBLICATIONS

H. Akiyama et al. "Partial lifetime control in IGBT by helium irradiation through mask patterns" Proc. ISPSD '91, p. 187.*

* cited by examiner

*Primary Examiner*—Thanh V Pham
*Assistant Examiner*—Mark A Laurenzi, III
(74) *Attorney, Agent, or Firm*—Coats & Bennett, P.L.L.C.

(57) ABSTRACT

The invention relates to a high-speed diode comprising a semiconductor body (1), in which a heavily n-doped zone (8), a weakly n-doped zone (7) and a weakly p-doped zone (6) are arranged successively in a vertical direction (v), between which a pn load junction (4) is formed. A number of heavily p-doped islands (51-57) spaced apart from one another are arranged in the weakly p-doped zone (6). In this case, it is provided that the cross-sectional area density of the heavily p-doped islands (51-57) is smaller in a first area region (100) near to the edge than in a second area region (200) remote from the edge.

22 Claims, 8 Drawing Sheets

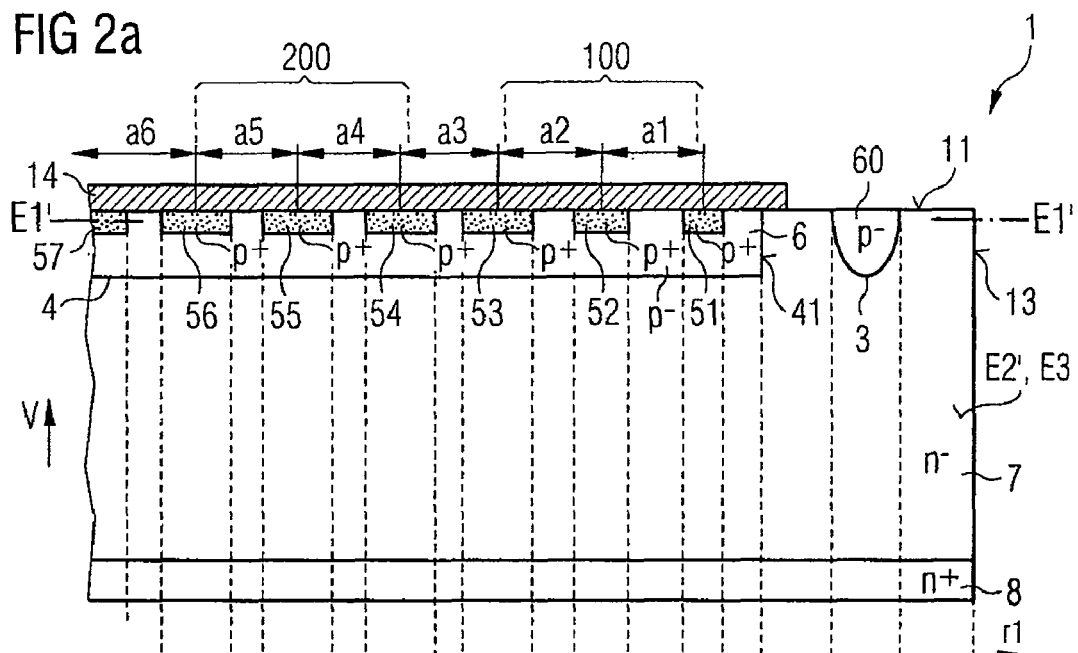
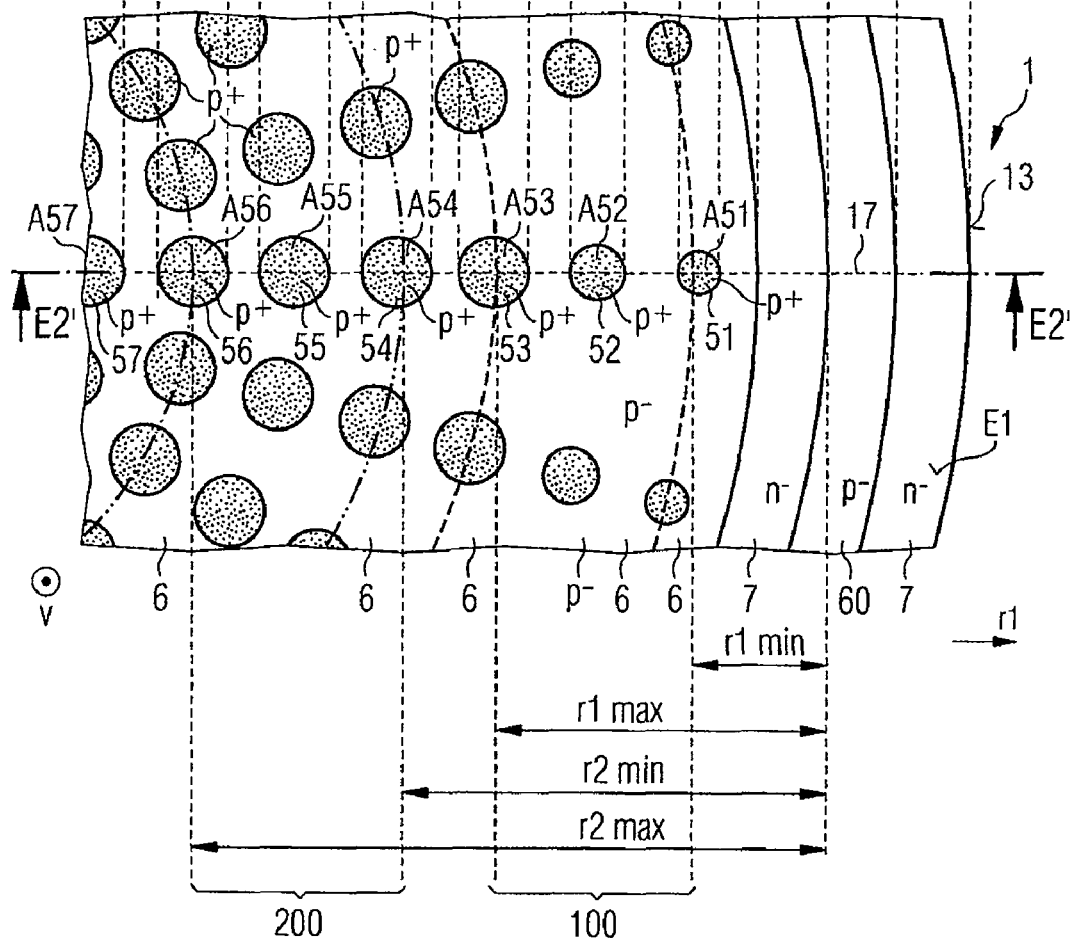

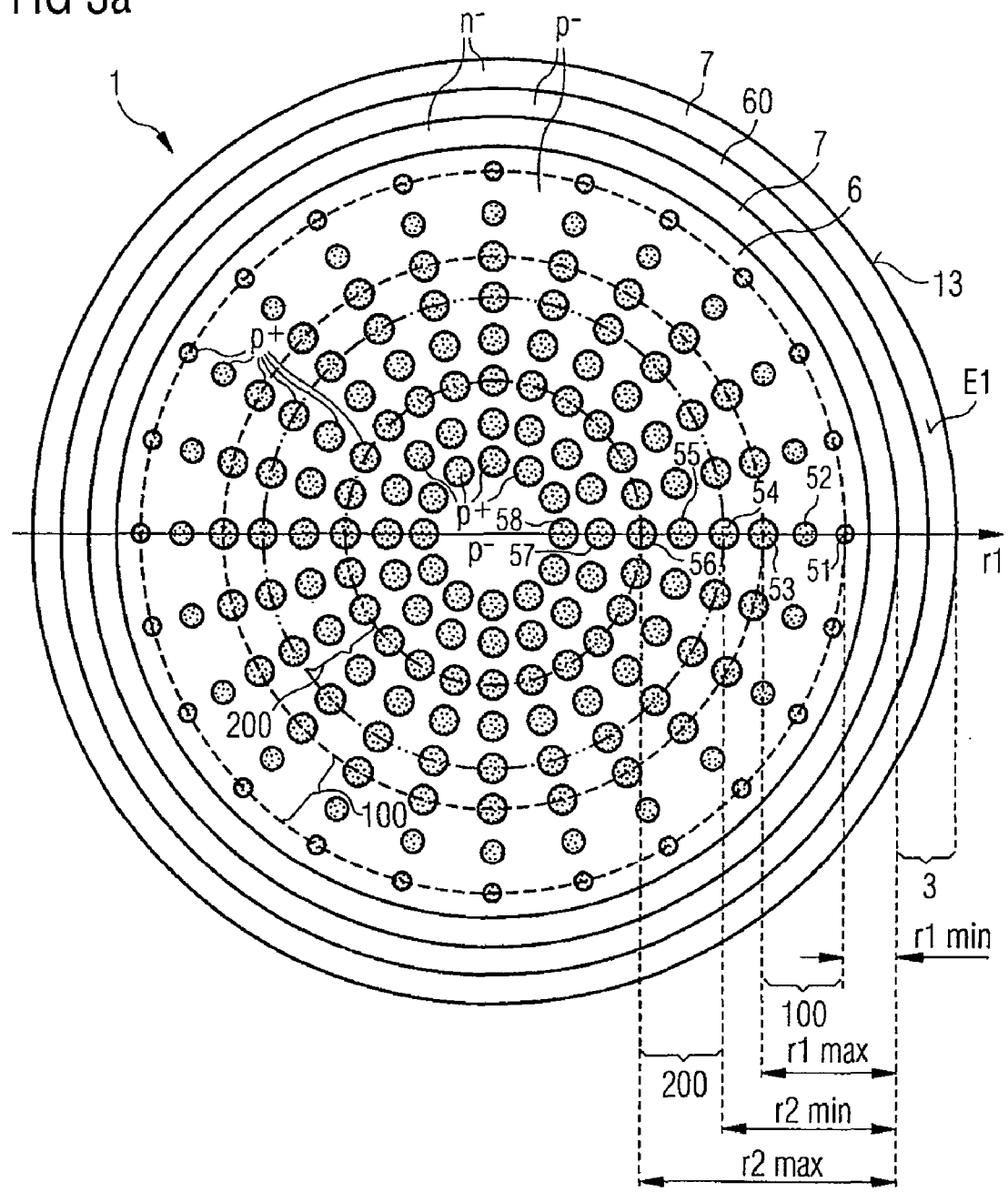

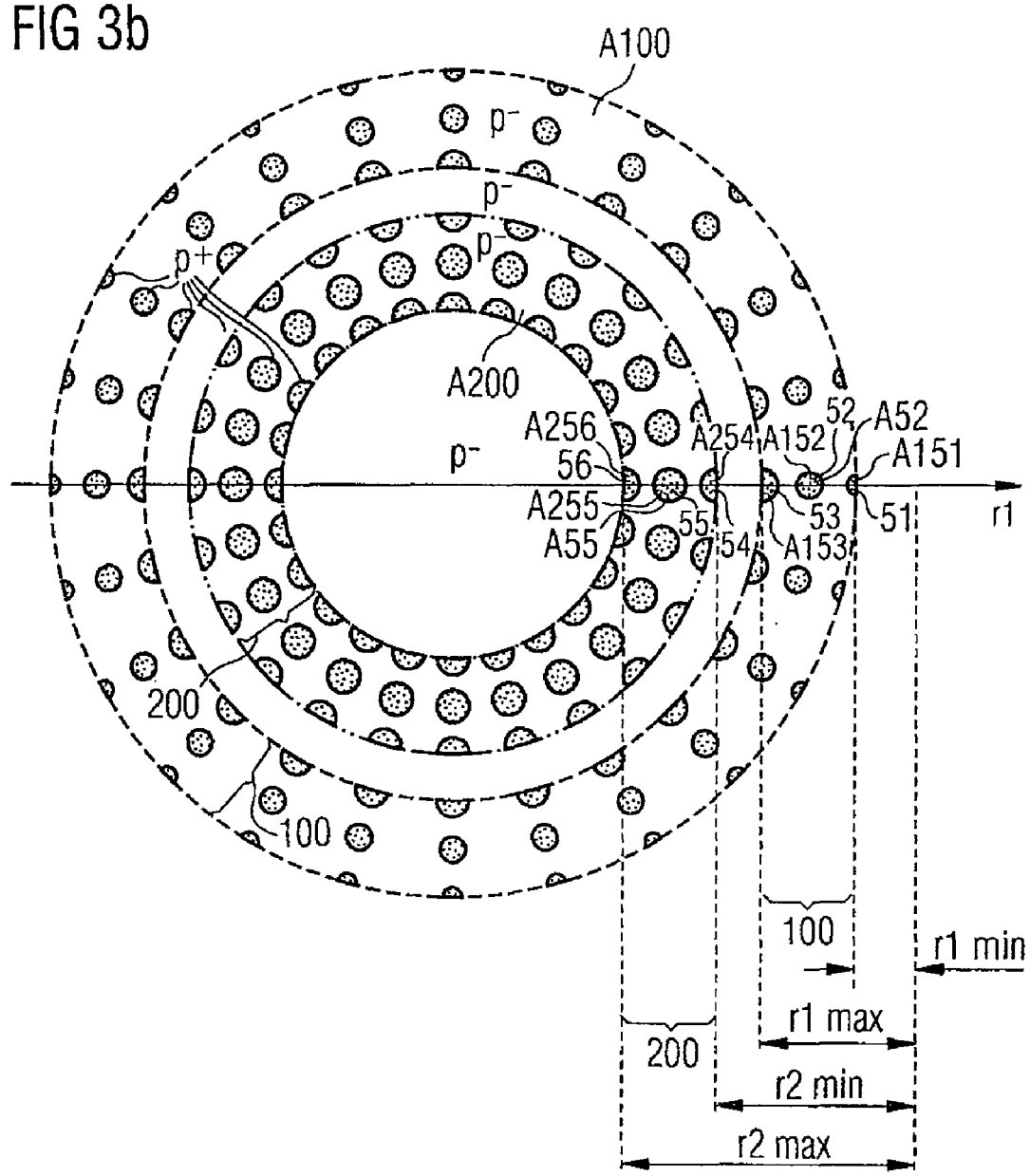

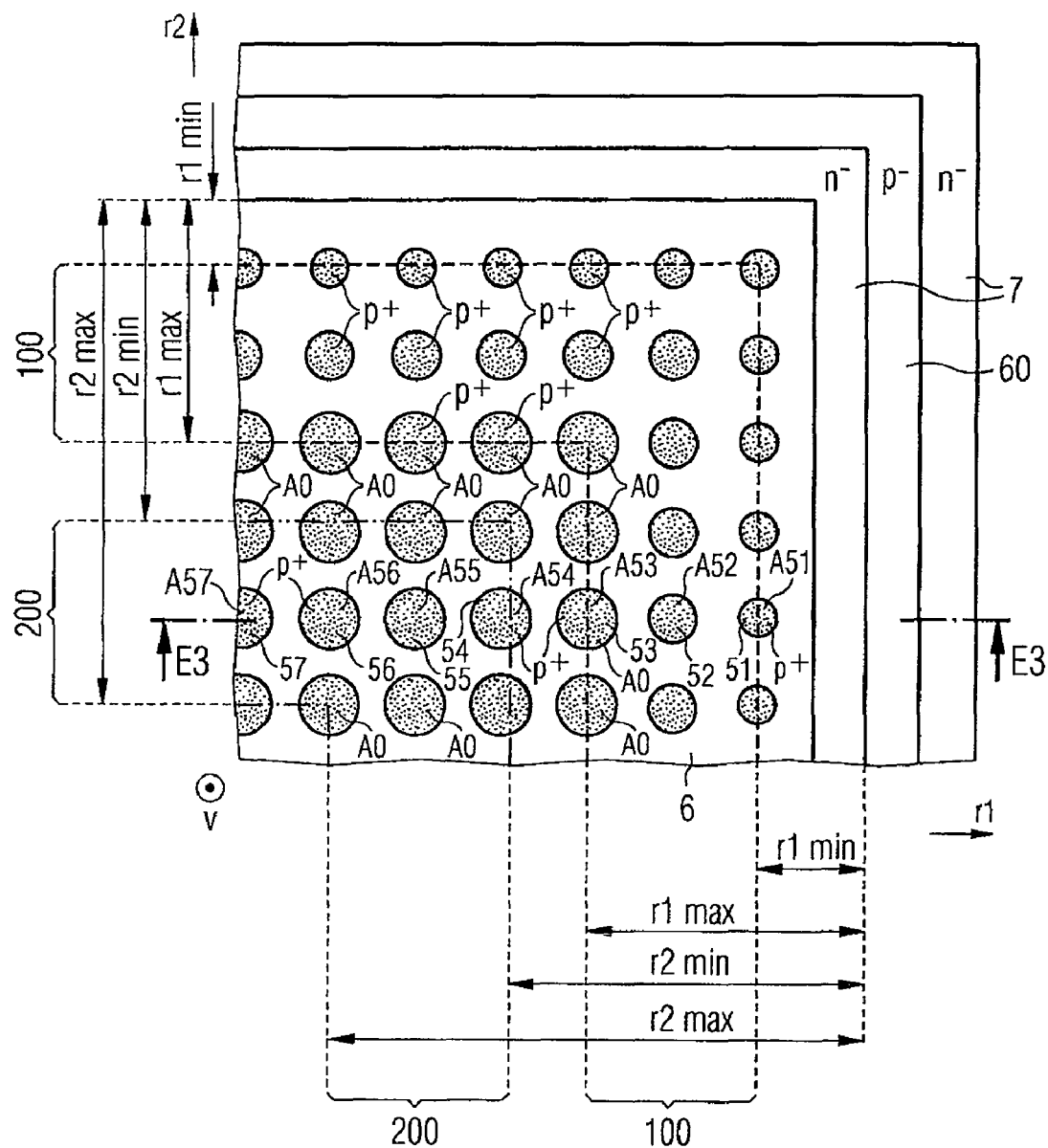

HIGH SPEED DIODE

CROSS-REFERENCE TO RELATED APPLICATIONS

This application claims priority to German application number 10 2005 023 882.3 filed May 24, 2005, the contents of which is hereby incorporated by reference in its entirety.

TECHNICAL FIELD

The invention relates to a high-speed diode, in particular a high-speed power diode. Diodes of this type must on the one hand have a very good surge current strength and on the other hand also have a sufficient dynamic robustness. Moreover, the losses occurring during operation are to be kept as small as possible.

BACKGROUND

For this purpose, CAL diodes (CAL=Controlled Axial Lifetime) and EMCON diodes (EMCON=Emitter Controlled) have become established in the past. In the case of CAL diodes, a heavily doped p-type emitter is used, but the latter additionally requires intensive helium irradiation and further methods for reducing the charge carrier lifetime in order that the turn-off losses do not become too high. EMCON diodes, by contrast, have a relatively weakly p-doped emitter. However, a reduced surge current strength is disadvantageous in this case.

A further diode variant is the so-called "speed diode". FIG. 1a shows a detail from such a speed diode in a vertical section. The speed diode comprises a semiconductor body 1 with an edge 13. In the semiconductor body 1, a heavily n-doped zone 8, a weakly n-doped zone 7 and a p-doped zone 6 are arranged successively in a vertical direction v. A pn junction 4 is formed between the weakly n-doped zone 7 and the p-doped zone 6, and constitutes the load junction 4 of the speed diode. The p-doped zone 6 is part of the so-called p-type emitter, and the heavily n-doped zone 8 is also referred to as an n-type emitter.

Arranged in the p-doped zone 6 are a number of identical heavily p-doped islands 51-57 which are arranged in a manner spaced apart equidistantly with respect to one another and extend into the p-doped zone 6 proceeding from the front side 11 of the semiconductor body 1. While the forward current of the diode essentially flows via the weakly p-doped zone 6 during normal operation, in the surge current case charge carriers are injected from the heavily p-doped islands 51-57 into the weakly p-doped zone 6.

The speed diode furthermore has an edge structure 60 formed as a p-type field ring. FIG. 1b shows a horizontal section in a plane E1 running through the heavily p-doped islands 51-57. The vertical section in accordance with FIG. 1a runs in a plane E2 parallel to the vertical direction v. It can be seen from the illustration in accordance with FIG. 1b that adjacent heavily p-doped islands 51-57 are spaced apart equidistantly with respect to one another both in a first lateral direction r1 perpendicular to the vertical direction v and in a second lateral direction r2 perpendicular to the vertical direction v and to the first lateral direction r1.

In the case of this speed diode, however, relatively high overall losses occur on account of a high charge carrier density in the edge region of the pn load junction 4. Furthermore, its dynamic robustness is unsatisfactory.

SUMMARY

A high-speed diode may comprise a semiconductor body, in which a heavily n-doped zone, a weakly n-doped zone and a weakly p-doped zone are arranged successively in a vertical direction. A pn load junction is formed between the weakly n-doped zone and the weakly p-doped zone. The high-speed diode has an edge structure for reducing the field strength loading in the edge region of the semiconductor body.

A number of heavily p-doped islands extend into the weakly p-doped zone proceeding from that side of the weakly p-doped zone which is remote from the weakly n-doped zone.

A first area region extending in a sectional plane that is perpendicular to the vertical direction and runs through the weakly p-doped zone and the heavily p-doped islands is defined by virtue of the fact that the distance measured in the sectional plane between each point of the first area region and the edge structure is greater than or equal to a first distance and less than or equal to a second distance.

A second area region of the sectional plane is defined by virtue of the fact that the distance measured in the sectional plane between each point of the second area region and the edge structure is greater than or equal to a third distance and less than or equal to a fourth distance, the third distance being greater than or equal to the second distance.

The heavily p-doped islands are chosen with regard to their dimensions and/or their arrangement such that the ratio between the total area of the regions of the island cross-sectional areas that are located within the first area region and the area of the first area region is less than the ratio between the total area of the regions of the island cross-sectional areas that are located within the second area region and the area of the second area region.

BRIEF DESCRIPTION OF THE DRAWINGS

The invention is described in more detail below on the basis of exemplary embodiments with reference to figures, in which:

FIG. 2b shows a horizontal section through the edge region of the high-speed diode in accordance with FIG. 2a in the region of the heavily p-doped islands, FIG. 3a shows a horizontal section through the semiconductor body in the same sectional plane as the horizontal section in accordance with FIG. 2b with a first area region and a second area region, FIG. 3b shows the first area region and the second area region in accordance with FIG. 3a with the regions of the cross-sectional areas of the heavily p-doped islands which are located in the first and second area region, respectively, FIG. 4 shows a horizontal section through the corner region of a high-speed diode with a square cross section in the region of the heavily p-doped islands.

In the figures, identical reference symbols designate identical component regions.

DETAILED DESCRIPTION

Figure 1A:
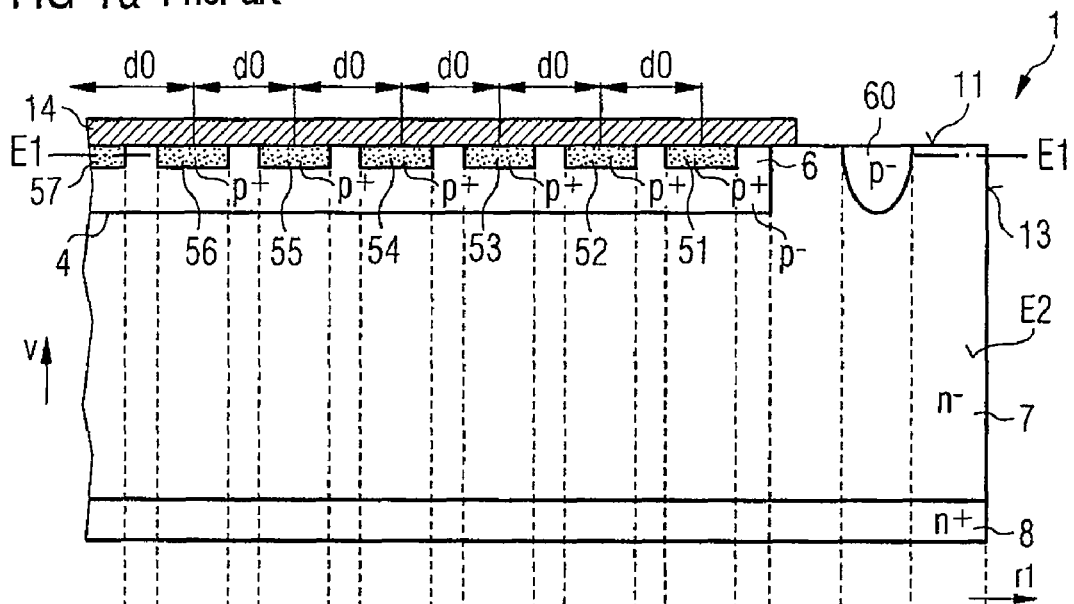
FIG. 1a shows a vertical section through the edge region of a high-speed diode in accordance with the prior art.
Figure 1B:
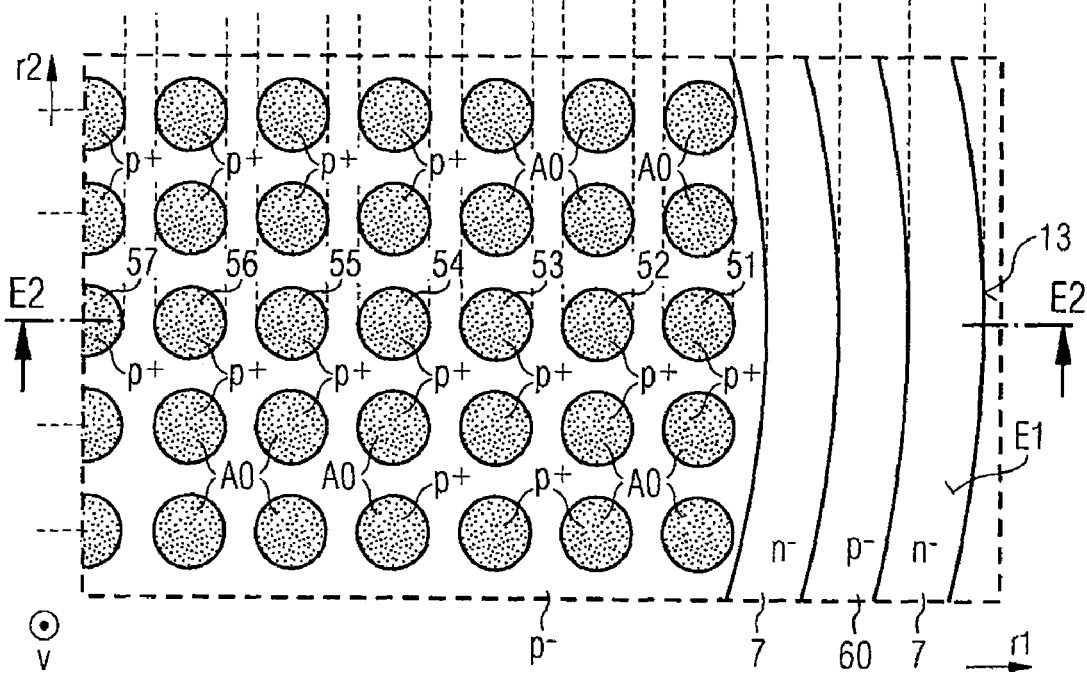
FIG. 1b shows a horizontal section through the edge region of the high-speed diode in accordance with FIG. 1a, FIG. 2a shows a vertical section through the edge region of a high-speed diode corresponding to the vertical section in accordance with FIG. 1a, in which the two islands closest to the edge structure in a lateral direction have a smaller diameter than all the other islands that are spaced apart further from the edge structure in the lateral direction.

In accordance with an embodiment, this is achieved by virtue of the fact that the average island cross-sectional area of the island cross-sectional areas that are arranged completely within the first area region is less than the average island cross-sectional area of the island cross-sectional areas that are arranged completely within the second area region.

In accordance with an embodiment, the average distance between the area centroids of the island cross-sectional areas of the island cross-sectional areas that are arranged completely within the first area region is greater than the average distance between the area centroids of the island cross-sectional areas of the island cross-sectional areas that are arranged completely within the second area region.

The arrangement of the heavily p-doped islands is preferably chosen such that the ratio between the total area of the regions of the island cross-sectional areas that are located within the first area region and the area of the first area region, presupposing a constant difference between the second distance and the first distance, increases monotonically or strictly monotonically as the first distance increases.

Particularly preferably, the distance between the edge structure and the heavily p-doped island located nearest to the latter in a lateral direction perpendicular to the vertical direction amounts to between one and three times the diffusion length of the minority charge carriers.

A further advantage arises if the weakly n-doped zone has, in a portion extending at least as far as the pn load junction proceeding from the edge of the semiconductor body in a lateral direction perpendicular to the vertical direction, a reduced diffusion length of the minority charge carriers. Such a portion having a reduced diffusion length of the minority charge carriers may be produced for example by radiating helium into the region in which the diffusion length of the minority charge carriers is intended to be reduced.

The portion having a reduced diffusion length of the minority charge carriers preferably has a length measured in the lateral direction which is greater by from one to three times the diffusion length of the minority charge carriers than the distance measured in the lateral direction between the weakly p-doped zone and the edge.

On that side of the weakly n-doped zone which is remote from the weakly p-doped zone, there is preferably arranged an n-doped zone which is more heavily n-doped than the weakly n-doped zone and which has a more weakly n-doped partial zone which extends as far as below the weakly p-doped zone proceeding from the edge of the semiconductor body in a lateral direction and which comprises in a lateral direction perpendicular to the vertical direction a region dimensioned such that the distance measured in the lateral direction between the end of the weakly p-doped zone that is near to the edge and the boundary between the weakly doped partial zone and the heavily doped partial zone amounts to from one to three times the diffusion length of the minority charge carriers.

Preferably, in this case the weakly n-doped partial zone and the weakly n-doped zone are n-doped to an identical degree.

It is furthermore advantageous if the semiconductor body has an edge portion in which the diffusion length of charge carriers is reduced relative to the diffusion length of charge carriers in the remaining portions of the semiconductor body by means of recombination centers.

Such an edge portion preferably extends into the semiconductor body proceeding from the edge in a lateral direction perpendicular to the vertical direction. Heavy metals, for example gold and/or platinum, which are introduced into the edge portion, are preferably suitable as recombination centers.

FIG. 2a shows a vertical section through the edge region of a high-speed diode. The latter has a semiconductor body 1, which preferably essentially has the form of a parallelepiped or a flat cylinder.

In the semiconductor body 1, a heavily n-doped zone 8, a weakly n-doped zone 7 and also a weakly p-doped zone 6 are arranged successively in a vertical direction v. A pn load junction 4 is formed between the weakly n-doped zone 7 and the weakly p-doped zone 6, and the load current of the high-speed diode flows via said pn load junction during operation of said diode.

In the lateral direction r1 between the weakly p-doped zone 6 and a lateral edge 13 of the semiconductor body 1, the semiconductor body 1 has an edge structure 60, which, in the present exemplary embodiment, is formed as a weakly p-doped field ring 3 extending into the weakly n-doped zone 7 proceeding from the front side 11 of the semiconductor body.

Instead of such a field ring 3, it is also possible to provide a plurality of such weakly p-doped field rings which are at a distance from one another in the lateral direction r1. Instead of or in addition to one or more field rings, the semiconductor body 1 may also have a nonplanar edge termination, for example an edge bevel, in the edge region 3. An edge termination with a so-called VLD edge (Variation of Lateral Doping) is like-wise conceivable.

A metallization 14 is applied to the front side 11 of the semiconductor body 1.

The weakly p-doped zone 6 has a number of heavily p-doped islands 51-57 which extend into the weakly p-doped zone 6 proceeding from the front side of the semiconductor body 1 and which are at a distance from one another in the lateral direction r1.

FIG. 2b illustrates a cross section through the semi-conductor body 1 in a plane E1'that is illustrated in FIG. 2b and runs through the weakly p-doped zone 6 and the heavily p-doped islands 51-57. The view in accordance with FIG. 2a illustrates a vertical section through the plane E2'illustrated in FIG. 2b.

FIG. 2b shows a number of heavily p-doped islands, only some of which, namely the islands 51-57, are provided with reference symbols. The explanations below concerning the heavily p-doped islands 51-57 are given in a manner that is representative of all the heavily p-doped islands of the high-speed diode.

It can be seen from FIG. 2b that the heavily p-doped islands preferably have circular cross-sectional areas A51-57. In principle, however, the cross-sectional areas A51-A57 may be shaped arbitrarily, for example hexagonally.

The boundary lines of a first area region 100 of the cross-sectional plane E1 are illustrated in dashed fashion in FIGS. 2a and 2b. The first area region 100 is defined such that, for each point within the first area region 100, the distance to the edge structure 60 measured in the cross-sectional plane E1 is greater than or equal to a first distance r1min and less than or equal to a second distance r1max.

A second area region 200, which is likewise arranged in the cross-sectional plane E1 and illustrated by dashed boundary lines, is defined such that, for each point within the second area region 200, the distance to the edge structure 60 measured in the cross-sectional plane E1 is greater than or equal to a third distance r2min and less than or equal to a fourth distance r2max. In this case, the third distance r2min is greater than or equal to the second distance r1max.

As a result, the first and second area regions 100, 200 are formed as areal strips which run parallel to the edge structure 60 and have constant widths r1max-r1min and r2max-r2min, respectively. Consequently, the second area region 200 is arranged on that side of the first area region which is remote from the edge structure 60.

In this case, the first area region 100 and the second area region 200 may adjoin one another or be spaced apart from one another.

FIG. 3a shows—reduced in size relative to FIGS. 2a and 2b—a complete view of the cylindrical semiconductor body 1 in the cross-sectional plane E1. In order to achieve a better mode of illustration, the illustration is not true to scale. The number of heavily p-doped islands 51-57 has also been chosen with regard to the clearest possible illustration. The number of heavily p-doped islands of a real high-speed diode may deviate from this.

In the case of a cylindrical semiconductor body 1 as illustrated here, the first and second area regions 100, 200 are preferably formed in annular fashion in each case. In the case of an essentially parallelepipedal semiconductor body 1 (not illustrated), said regions are preferably formed as rectangular frames with rounded corners.

The illustration in accordance with FIG. 3b corresponds to that from FIG. 3a, only the first area region 100 and the second area region 200 being shown for illustrative purposes.

The cross-sectional areas of the heavily p-doped islands may be arranged completely—as in the case of the heavily p-doped island 52—or partially—as in the case of the heavily p-doped island 51, 53—within the first area region 100. In the last-mentioned case, only partial areas A151, A153 of the cross-sectional areas A51 and A53, respectively, illustrated in FIG. 3a in each case lie within the first area region 100.

The cross-sectional areas of the heavily p-doped islands may correspondingly be arranged completely—as in the case of the heavily p-doped island 55—or partially—as in the case of the heavily p-doped islands 54, 56—within the second area region 200. In the last-mentioned case, only partial areas A254, A256 of the cross-sectional areas A54 and A56, respectively, illustrated in FIG. 3a in each case lie within the second area region 200.

The total area of all the partial areas A151, A152, A153, . . . of the heavily p-doped islands 51, 52, 53 that are arranged within the first area region 100 is designated below by AQ100. It is calculated as follows:

$$AQ100 = \ldots + A151 + A152 + A153+ \quad (1)$$

The area AQ200 of all the partial areas A254, A255, A256, . . . of the heavily p-doped islands 54, 55, 56 that are arranged within the second area region 200 is calculated in the corresponding manner as follows:

$$AQ200 = \ldots + A254 + A255 + A256+ \quad (2)$$

The total area of the first area region 100 is designated below by A100, and the area of the second area region 200 by A200. The following holds true in the case of the present annular area regions A100, A200:

$$A100 = 2 \cdot \pi \cdot (r1\text{max} - r1\text{min}) \quad (3)$$

$$A200 = 2 \cdot \pi \cdot (r2\text{max} - r2\text{min}) \quad (4)$$

According to an embodiment, it is provided that the proportion of the area A100 of the first area region 100 that is made up by the partial areas 151, 152, 153, . . . of the cross-sectional areas A51, A52, A53, . . . of the heavily p-doped islands 51, 52, 53, that are arranged within the first area region 100 is less than the proportion of the area A200 of the second area region 200 that is made up by the partial areas 254, 255, 256, . . . of the cross-sectional areas A54, A55, A56, . . . of the heavily p-doped islands 54, 55, 56, . . . that are arranged within the second area region 200.

This relationship can be expressed as follows:

$$\frac{AQ100}{A100} < \frac{AQ200}{A200} \quad (5)$$

To put it another way, the cross-sectional area density of the heavily p-doped islands 51-57 in the first area region 100 is less than that in the second area region.

In order to realize a high-speed diode which satisfies the relationship formulated in equation (5), various variants are provided:

In a first variant, the cross-sectional areas A51-A57, . . . of the heavily p-doped islands 51-57, are chosen such that at least along a lateral direction, for example along the lateral direction r1 illustrated in FIGS. 2a -3b, the cross-sectional area A52 of an arbitrary heavily p-doped island 52 is less than or equal to the cross-sectional area A53-A57, . . . of any other heavily p-doped island 53-57, . . . which is spaced apart further from the edge structure 60 than the relevant heavily p-doped island 52. In this case, the alternative "less than" must apply at least to one of the heavily p-doped islands 52.

A second variant provides for choosing the average distance between the area centroids of the island cross-sectional areas of all the island cross-sectional areas A52 that are arranged completely within the first area region 100 such that it is greater than the average distance between the area centroids of the island cross-sectional areas A55 of all the island cross-sectional areas A55 that are arranged completely within the second area region 200.

In accordance with a third variant, which can be seen in particular from FIG. 3a and is preferably used in the case of high-speed diodes having a circular cross section, the heavily p-doped islands 51-57, . . . are arranged "radially" along different lateral directions at least within a region adjoining the edge structure 60. In accordance with a special case of the first variant, the average island cross-sectional area of the island cross-sectional areas A52 that are arranged completely within the first area region 100 is less than the average island cross-sectional area of the island cross-sectional areas A55 that are arranged completely within the second area region 200.

A special case of the second variant is shown in FIGS. 2a and 2b. Here, along a first straight line 17 running laterally or radially, the area centroids of adjacent cross-sectional areas A53, A54, A55, A56, A57, . . . which are spaced apart from the edge structure 60 at least as far as the cross-sectional area A53 are spaced apart to an identical extent at distances a3=a4=a5=a6 from one another. By contrast, the distance a1 between the area centroids between the cross-sectional areas A51 and A52 is greater than the distance a2 between the area centroids between the cross-sectional areas A52 and A53, which is in turn greater than the distances a3, a4, a5 and a6.

The first, second and third variants may be combined arbitrarily with one another as long as the condition formulated in equation (5) is met.

In accordance with an embodiment, in a lateral direction r1 the cross-sectional areas A51-A57, . . . of the heavily p-doped islands 51-57, . . . increase monotonically or strictly monotonically as the distance of the cross-sectional area centroids of said p-doped islands 51-57, . . . from the edge structure 60 increases.

In accordance with an embodiment, the cross-sectional areas A51-A57, . . . of the heavily p-doped islands 51-57, . . . increase monotonically or strictly monotonically, independently of a lateral direction, as the distance of the cross-sectional area centroids of said p-doped islands 51-57, . . . from the edge structure 60 increases.

In accordance with a further preferred embodiment, the ratio between the total area AQ100 of the regions A151, A152, A153 of the island cross-sectional areas A51, A52, A53 that are located within the first area region 100 and the area A100 of the first area region 100, presupposing a constant difference r1max-r1min between the second distance r1max and the first distance r1min, increases monotonically or strictly monotonically as the first distance r1min increases.

FIG. 4 shows a horizontal section through a further preferred exemplary embodiment of a high-speed diode. In this case, the semiconductor body 1 is formed in parallelepipedal fashion and has a rectangular or square cross section. The first area region 100 and the second area region 200 are correspondingly formed as rectangular or as square frames, preferably with rounded corners.

The vertical section illustrated in FIG. 2a also corresponds to a vertical section through the plane E3 illustrated in FIG. 4.

The area centroids of the cross-sectional areas A51-A57, . . . —that is to say the midpoints of the circular cross-sectional areas in the present exemplary embodiment—of the heavily p-doped islands 51-57, . . . illustrated in FIG. 4 are arranged on the crossover points of a square grid network (not illustrated). This means that the area centroids of the cross-sectional areas of heavily p-doped islands 51-57, . . . are spaced apart equidistantly in a first lateral direction r1 and in a second lateral direction r2 perpendicular to the first lateral direction r1.

Furthermore, all the heavily p-doped islands which are spaced apart from the edge structure 60 at least as far as the heavily p-doped island 53 have the same cross-sectional area A0=A53.

By contrast, the cross-sectional areas A51, A52, . . . of all the heavily p-doped islands which, like e.g. the heavily p-doped islands 51, 52, . . . , are spaced apart from the edge structure 60 to a lesser distance than the cross-sectional area A53 of the heavily p-doped island 53 are smaller than the cross-sectional area A53 of the heavily p-doped island 53.

In this case, in accordance with an embodiment, the cross-sectional areas A51, A52, . . . of all the heavily p-doped islands 51, 52, . . . which are spaced apart from the edge structure 60 to a lesser distance than the cross-sectional area A53 of the heavily p-doped island 53 increase with increasing distance from the edge structure 60.

Figure 5:
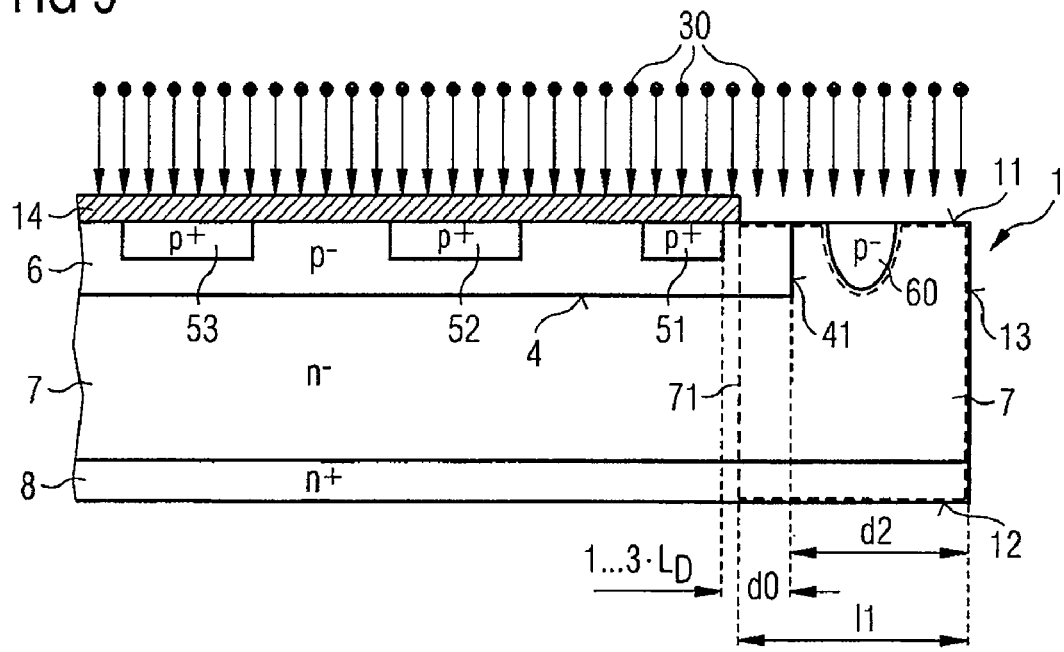
FIG. 5 shows a vertical section through a high-speed diode in accordance with FIG. 2a, in which helium is implanted into the semiconductor body.

Further improvements of the electrical properties of a high-speed diode are illustrated in FIG. 5.

The heavily p-doped island 51 closest to the edge region 3 in the lateral direction r is at a distance d0 from the side 41 of the pn load junction 4 that faces the edge 13. Said distance d0 is preferably from one to three times the diffusion length $L_D$ of the minority charge carriers.

Furthermore, the invention provides—as likewise illustrated in FIG. 5—for reducing the diffusion length of the charge carriers in a portion 71 of the weakly n-doped zone 7 by radiating helium ions 30 into the semiconductor body 1. The helium ions 30 are radiated into the semiconductor body 1 externally through the front side 11. For this purpose, an anode electrode 14, which is arranged on the front side 11 of the semiconductor body 1 and makes contact with the weakly p-dope zone 6 and also the heavily p-doped islands 51, 52, 53, . . . , is preferably used as a mask. Optionally, a separate mask spaced apart from the front side 11 may also be used for irradiation.

The portion 71 extends in the first lateral direction r1 proceeding from the edge 13 at least as far as the side 41 facing the edge 13 of the pn load junction 4.

The portion 71 particularly preferably has, in the first lateral direction r1 a width l1=d2+d0 composed of a lateral distance d2 between the weakly p-doped zone 6 and the edge and a lateral dimension d0 over which the weakly p-doped zone 6 and the portion 71 overlap. In this case, said dimension d0 amounts to from one to three times the diffusion length of the minority charge carriers.

Figure 6:
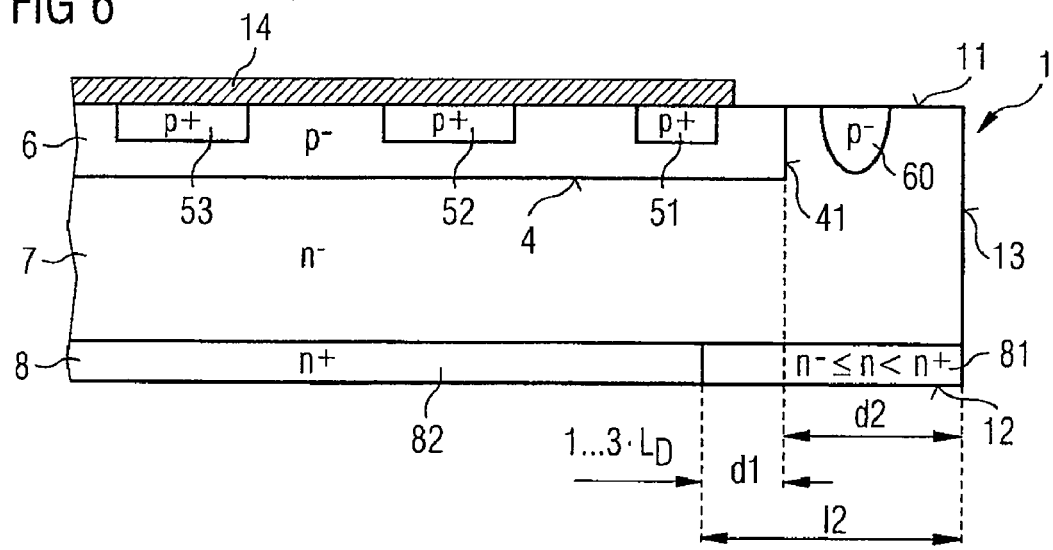
FIG. 6 shows a vertical section through a high-speed diode which has an n-type emitter which is arranged on the rear side of the semiconductor body and which contain a heavily n-doped zone and a more weakly n-doped partial zone on its side facing the edge of the semiconductor body.

It is furthermore advantageous to additionally reduce the current density at the edge of the semiconductor body 1 during operation of the high-speed diode. For this purpose, as is shown in FIG. 6, the doping of a first partial zone 81 of the heavily n-doped zone 8 may be reduced compared with the doping of a second partial zone 82 of the heavily n-doped zone 8. In this case, the n-type doping of the first partial zone 81 is greater than or equal to the n-type doping of the weakly n-doped zone 7.

The first partial zone 81 has, in the first lateral direction r1, a width 12 preferably corresponding at least to the distance a0 between the edge 13 and the pn load junction 4, that is to say the side 41 of the pn load junction 4 that faces the edge 13.

The first partial zone 81 preferably extends as far as below the weakly p-doped zone 6 proceeding from the edge 13, the length 12 of the partial zone 81 measured in the first lateral direction r1 being dimensioned such that the distance d1 measured in the first lateral direction r1 between the end 41 of the weakly p-doped zone 6 that is near to the edge and the boundary between the weakly and heavily doped partial zones 81 and 82 amounts to from one to three times the diffusion length of the charge carriers.

Figure 7:
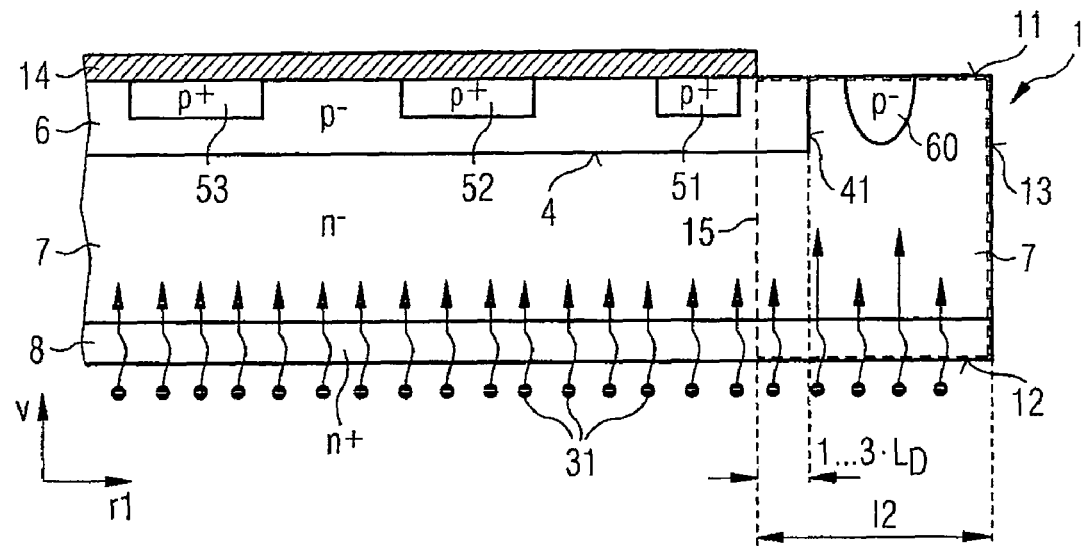
FIG. 7 shows a vertical section through a high-speed diode in which heavy metals are diffused into the semiconductor body from the rear side.

In accordance with a further preferred embodiment of the invention as illustrated in FIG. 7, the diffusion length of charge carriers is reduced in an edge portion 15 of the semiconductor body 1 compared with the other portions of the semiconductor body 1 on account of re-combination centers originating from indiffused heavy metals 31. The edge portion 15 extends into the semiconductor body 1 in the first lateral direction r1 proceeding from the edge 13 of the semiconductor body 1.

The recombination centers are preferably formed by one or more heavy metals 31, for example gold and/or platinum, which are indiffused into the semiconductor body 1, proceeding from the rear side 12 thereof, preferably over the whole area. The heavily n-doped zone 8, which is preferably produced by means of phosphorus diffusion, gives rise to gettering effects of the heavy metals in the phosphorus-doped zone, which are all the more effective, the higher the phosphorus doping concentration. If the phosphorus concentration of the heavily n-doped zone 8 is therefore decreased in the edge region or, as illustrated in FIG. 7, completely omitted in the extreme case, then this automatically has the consequence—as desired—that the minority charge carrier lifetime is reduced in the edge region 15 of the weakly n-doped zone 7 in comparison with the remainder of this zone.

As an alternative, the indiffusion of the heavy metals 31 may also be effected proceeding from the front side 11 of the semiconductor body 1.

Figure 8:
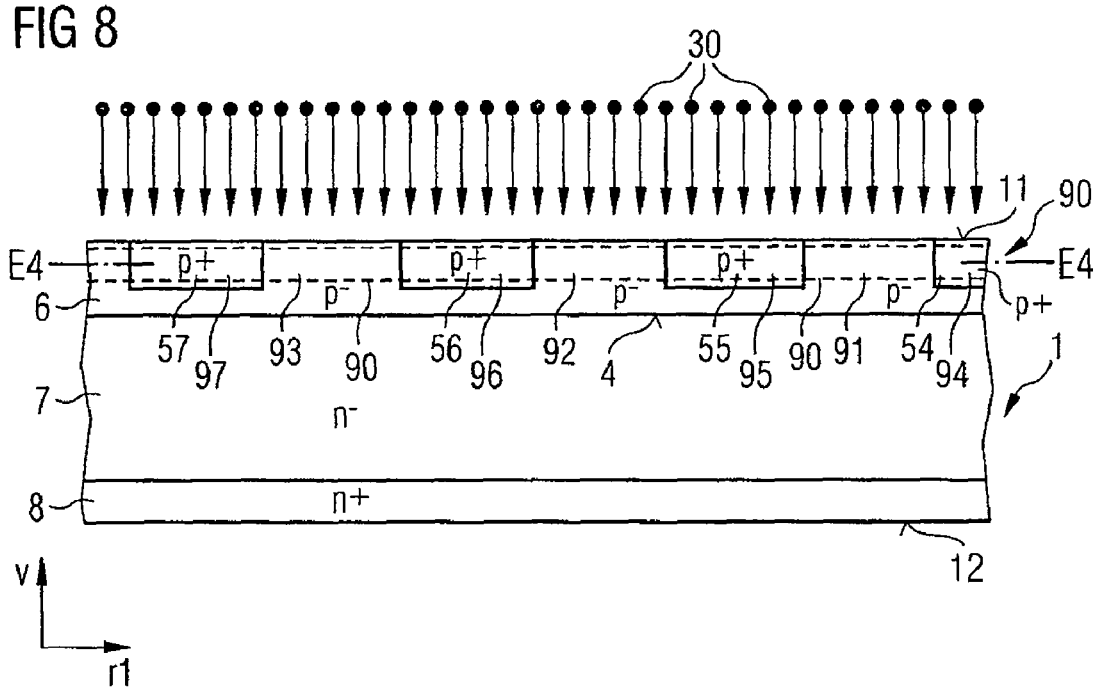
FIG. 8 shows a vertical section through a high-speed diode in which, proceeding from the front side of the semiconductor body, particles are implanted into the weakly p-doped zone and into the heavily p-doped islands.

FIG. 8 shows a further variant of a high-speed diode formed as a speed diode and having increased dynamic robustness and reduced overall losses.

The diode has a semiconductor body 1, in which a heavily n-doped zone 8, a weakly n-doped zone 7 and a weakly p-doped zone 6 are arranged successively in a vertical direction v, between which a pn load junction 4 is formed.

A number of heavily p-doped islands 54, 55, 56, 57 which are spaced apart from one another in a first lateral direction r1 perpendicular to the vertical direction v are arranged in the weakly p-doped zone 6.

The distances between the area centroids of the cross-sectional areas in a cross-sectional plane E4 of these heavily p-doped islands 54, 55, 56, 57 in the first lateral direction r1 and/or the size of the cross-sectional areas of these heavily p-doped islands 54, 55, 56, 57 in a plane E4 perpendicular to the vertical direction v are preferably chosen in the manner described with reference to the preceding FIGS. 2a-7. The configuration of the heavily p-doped islands should preferably satisfy the relationship formulated in equation (5). In principle, the cross-sectional areas of the heavily p-doped islands 54, 55, 56, 57 and also the distances thereof with respect to one another may be chosen in any desired manner, however, in the present exemplary embodiment in accordance with FIG. 8.

In a region formed from the weakly p-doped zone 6 and the heavily p-doped islands 54, 55, 56, 57, the semiconductor body 1 has a zone 90 illustrated in dashed fashion, in which zone the charge carrier lifetime has been reduced by means of the implantation of particles 30. Light ions, in particular hydrogen or helium ions, are primarily suitable as implantation particles 30.

In this case, the zone 90 is spaced apart from the rear side 12 of the semiconductor body 1 preferably at the same distance as or further than the heavily p-doped islands 54, 55, 56, 57. This is advantageous particularly in the region of the heavily p-doped islands 54, 55, 56, 57 since the implantation does not then give rise to any undesirable reduction of the charge carrier lifetime in the weakly p-doped zone 6 below the heavily p-doped islands 54, 55, 56, 57.

The zone 90 may, in the vertical direction v, both extend as far as the front side 11 of the semiconductor body 1 and be spaced apart from said front side.

The implantation is expediently effected preferably proceeding from the front side 11 of the semiconductor body 1. In accordance with one preferred embodiment, particles 30 are in this case implanted over the entire front side 11 of the semiconductor body, so that the zone 90 extends over the entire semiconductor body 1 in the lateral direction r.

The charge carrier lifetime is dependent on doping. Therefore, the charge carrier lifetime reduction has a more pronounced effect in the weakly p-doped portions 91, 92, 93 of the zone 90 than in the heavily p-doped portions 94, 95, 96, 97.

With suitably chosen parameters, a profile of the charge carrier concentration that is similar to the profile of the charge carrier concentration of an EMCON or CAL diode can thereby be achieved in the on state in particular in the vicinity of the front side 11 of the semiconductor body 1 in a vertical cross section outside the heavily doped p-type regions. The diode thus has an improved turn-off behavior.

The surge current strength, by contrast, is essentially maintained since the implantation-dictated reduction of the charge carrier lifetime is only low in the heavily p-doped portions 94, 95, 96, 97 of the zone 90.

Figure 9:
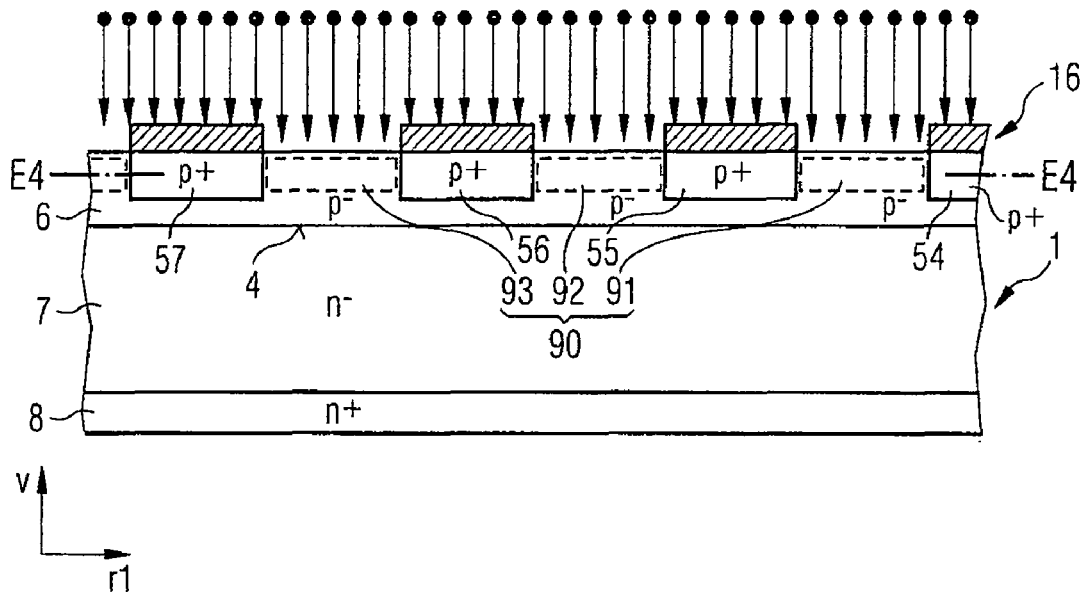
FIG. 9 shows a vertical section through a high-speed diode in which, by means of masked irradiation proceeding from the front side of the semiconductor body, particles are implanted only into the weakly doped regions and the heavily p-doped islands remain omitted from the implantation by means of the masking.

As is shown in FIG. 9, a further improvement of the surge current strength of such a high-speed diode can be achieved by means of a masked implantation. For this purpose, a mask 16 is arranged on the front side 11 of the semiconductor body 1 at least during the implantation, said mask being patterned in such a way that it prevents implantation particles 30 from penetrating into the heavily p-doped islands 54, 55, 56, 57 or at least reduces the quantity of the particles penetrating into the islands 54, 55, 56, 57. In this case, the implantation zone 90 is essentially arranged between the heavily p-doped islands 54, 55, 56, 57 in the first lateral direction r1.

Such a zone 90 with a reduced charge carrier lifetime may, in particular, also be provided in the case of all the high-speed diodes described with reference to FIGS. 2a to 7.

After the implantation it is advantageous for the semiconductor body 1 to be subjected to heat treatment for approximately 2 hours at a temperature of between approximately 220 and 270° C.

Figure 10:
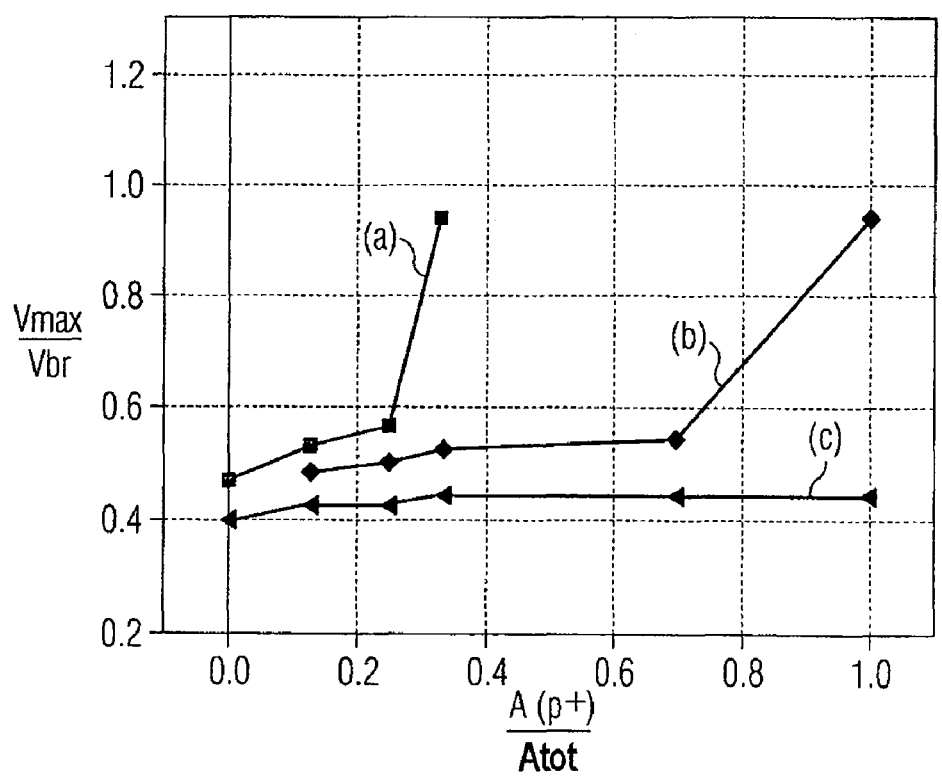
FIG. 10 shows a diagram representing the dependence of the voltage that maximally occurs during the turn-off of various high-speed diodes on the area proportion of the heavily p-doped zones with regard to the total diode area.

FIG. 10 shows a diagram representing the dependence of the maximum voltage Vmax occurring during the turn-off of various high-speed diodes on the cross-sectional area ratio a(p+)/Atot of the heavily p-doped zones with respect to the total diode area Atot.

In this case, Atot is the cross-sectional area of the semiconductor body in a plane perpendicular to the vertical direction. Correspondingly, A(p+) is the total cross-sectional area of all the heavily p-doped zones in a sectional plane E1', E4—perpendicular to the vertical direction v—in accordance with FIGS. 2a, 8 and 9 through the heavily p-doped zones.

In the diagram, the ratio A(p+)/Atot is plotted on the abscissa and the ratio between the maximum dynamic breakdown voltage Vmax occurring during the turn-off operation in the surge current situation and the static breakdown voltage Vbr is plotted on the ordinate. In all of the diodes, the lifetime in the weakly p-doped zone is in each case adapted such that they have the same forward voltage at their respective rated current.

Curve (a) relates to a high-speed diode in accordance with the prior art with a charge carrier lifetime τa of the semiconductor body that is homogeneous in the vertical direction.

The high-speed diodes relating to curves (b) and (c) have the same semiconductor zone arrangement. They each have a zone with reduced charge carrier lifetime which is formed according to the zone 90 in accordance with FIG. 8 and which, in a manner deviating from the zone 90 in accordance with FIG. 8, extends in the vertical direction proceeding from the front side in the direction of the pn load junction formed between the weakly n-doped zone and the weakly p-doped zone and in which the charge carrier lifetime has been reduced to a value τb (curve (b)) and τc (curve (c)), respectively. In this case, the charge carrier lifetime τb amounts to ten times the charge carrier lifetime τc.

In a homogeneous vertical charge carrier lifetime distribution (curve (a)), the ratio Vmax/Vbr rises significantly for area ratios A(p+)/Atot greater than or equal to 0.25, high values of Vmax/Vbr being equivalent to an undesirably hard turn-off behavior of the diode.

As a result of a moderate reduction of the charge carrier lifetime to a value τb (curve (b)) the area ratio A(p+)/Atot at which a transition from soft to hard turn-off behavior occurs is shifted toward higher values (approximately 0.7 in the case of curve (b)).

If, as in the case of the diode relating to curve (c), the charge carrier lifetime is reduced to a very great extent (τc) in the zone with a reduced charge carrier lifetime, then the diode exhibits a soft turn-off behavior independently of the area ratio A(p+)/Atot, in particular even for an area ratio of A(p+)/Atot=1.

LIST OF REFERENCE SYMBOLS

1 Semiconductor body
3 Field ring
4 pn load junction
6 Weakly p-doped zone
7 Weakly n-doped zone
8 Heavily n-doped zone
11 Front side of the semiconductor body
12 Rear side of the semiconductor body
13 Edge of the semiconductor body
14 Metallization
15 Edge portion
16 Mask
17 Straight line
30 Implantation particles, preferably hydrogen or helium ions
31 Heavy metal
41 Side of the pn load junction that faces the edge
51-57 Heavily p-doped island
60 Edge structure
71 Portion of the weakly n-doped zone
81 First partial zone of the heavily n-doped zone
82 Second partial zone of the heavily n-doped zone
90 Portion of the semiconductor body
91-93 Portion of the weakly p-doped zone
94-97 Portion of a heavily p-doped island
100 First area region
200 Second area region
a1-a6 Distance between the cross-sectional area centroids in the first lateral di-rection
d0 Distance between the heavily p-doped island nearest to the edge and the edge of the weakly p-doped zone
d1 Distance between the end of the weakly p-doped zone that is near to the edge, on the one hand, and the boundary between the weakly doped partial zone 81 and the heavily doped partial zone 82, on the other hand
d2 Distance between the weakly p-doped zone and the edge
A0 Cross-sectional areas
A51-A57 Cross-sectional areas
l1 Width of the portion 71 of the weakly n-doped zone
l2 Width of the partial zone 81
$L_D$ Diffusion length
r1 First lateral direction
r2 Second lateral direction
v Vertical direction
A100 Area of the first area region
A151-A153 Partial areas of the cross-sectional areas of the heavily p-doped islands that are arranged in the first area region
A254-A256 Partial areas of the cross-sectional areas of heavily p-doped islands that are arranged in the second area region
A200 Area of the second area region
A(p+) Cross-sectional area of all the heavily p-doped zones
Atot Cross-sectional area of the semiconductor body
AQ100 Total area of the partial areas of the cross-sectional areas of the heavily p-doped islands that are arranged in the first area region
AQ200 Total area of the partial areas of the cross-sectional areas of the heavily p-doped islands that are arranged in the second area region
E1, E1', E2' Cross-sectional plane
E2-E4 Cross-sectional plane
Vbr Static breakdown voltage
Vmax Maximum voltage occurring during the turn-off of the high-speed diode
r1max, r1min Distances
r2max, r2min Distances
τa, τb, τc Charge carrier lifetimes
LD Diffusion length

What is claimed is:

1. A high-speed diode comprising a semiconductor body, which has a front side and a rear side opposite thereto, in which a heavily n-doped zone, a weakly n-doped zone and a weakly p-doped zone are arranged successively proceeding from the rear side in a vertical direction, a pn load junction being formed between the weakly n-doped zone and the weakly p-doped zone,
which has a number of heavily p-doped islands which are arranged at a distance from one another in a lateral direction running perpendicular to the vertical direction and which extend into the weakly p-doped zone proceeding from that side of the weakly p-doped zone which faces the front side,
wherein
at least one further zone which is arranged in the weakly p-doped zone and which is spaced apart from the rear side at least as far as that island from among the heavily p-doped islands which is spaced apart the furthest from the rear side, and the charge carrier lifetime of said at least one further zone is reduced relative to the adjoining regions.

2. A high-speed diode according to claim 1, in which the at least one further zone reaches as far as the front side of the semiconductor body.

3. A high-speed diode according to claim 2, in which the at least one further zone is spaced apart from the front side of the semiconductor body.

4. A high-speed diode comprising:
a semiconductor body, in which a heavily n-doped zone, a weakly n-doped zone and a weakly p-doped zone are arranged successively in a vertical direction, a pn load junction being formed between the weakly n-doped zone and the weakly p-doped zone,
an edge structure for reducing the field strength loading in the edge region of the semiconductor body,
a number of heavily p-doped islands extending into the weakly p-doped zone proceeding from that side of the weakly p-doped zone which is remote from the weakly n-doped zone, a first area region of a sectional plane that is perpendicular to the vertical direction and runs through the weakly p-doped zone and the heavily p-doped islands, said first area region being defined by virtue of the fact that the distance measured in the sectional plane between each point of the first area region and the edge structure is greater than or equal to a first distance and less than or equal to a second distance, a second area region of the sectional plane, said second area region being defined by virtue of the fact that the distance measured in the sectional plane between each point of the second area region and the edge structure is greater than or equal to a third distance and less than or equal to a fourth distance, the third distance being greater than or equal to the second distance, wherein the ratio between the total area of the regions of the island cross-sectional areas that are located within the first area region and the area of the first area region being less than the ratio between the total area of the regions of the island cross-sectional areas that are located within the second area region and the area of the second area region.

5. A high-speed diode according to claim 4, in which the average island cross-sectional area of the island cross-sectional areas that are arranged completely within the first area region is less than the average island cross-sectional area of the island cross-sectional areas that are arranged completely within the second area region.

6. A high-speed diode according to claim 4, in which the average distance between the island cross-sectional areas that are arranged completely within the first area region is greater than the average distance between the island cross-sectional areas that are arranged completely within the second area region.

7. A high-speed diode according to claim 4, in which the ratio between the total area of the regions of the island cross-sectional areas that are located within the first area region and the area of the first area region, presupposing a constant difference between the second distance and the first distance increases monotonically or strictly monotonically as the first distance increases.

8. A high-speed diode according to claim 4, in which the distance between the edge structure and the heavily p-doped island located nearest to the latter in a lateral direction perpendicular to the vertical direction amounts to between one and three times the diffusion length of the minority charge carriers.

9. A high-speed diode according to claim 4, in which the weakly n-doped zone has, in a portion extending at least as far as the pn load junction proceeding from the edge in a lateral direction perpendicular to the vertical direction, a diffusion length of the minority charge carriers that is reduced by irradiation with helium.

10. A high-speed diode according to claim 9, in which the portion of the weakly n-doped zone and the weakly p-doped zone overlap over a dimension in a lateral direction, said dimension amounting to from one to three times the diffusion length of the minority charge carriers.

11. A high-speed diode according to claim 4, in which, on that side of the weakly n-doped zone which is remote from the weakly p-doped zone, there is arranged an n-doped zone which is more heavily n-doped than the weakly n-doped zone and which has a more weakly n-doped partial zone which extends as far as below the weakly p-doped zone proceeding from the edge in a lateral direction perpendicular to the vertical direction and which comprises a region dimensioned such that the distance dl measured in the lateral direction between the end of the weakly p-doped zone that is near to the edge and the boundary between the weakly doped partial zone and the heavily doped partial zone amounts from one to three times the diffusion length of the minority charge carriers.

12. A high-speed diode according to claim 11, in which the partial zone and the weakly n-doped zone are n-doped to an identical degree.

13. A high-speed diode according to claim 4, in which the semiconductor body has an edge portion extending into the semiconductor body proceeding from the edge in a lateral direction perpendicular to the vertical direction, in which the diffusion length of charge carriers is reduced relative to the diffusion length of charge carriers in the remaining portions of the semiconductor body by means of recombination centers.

14. A high-speed diode according to claim 13, in which the recombination centers are formed by at least one heavy metal.

15. A high-speed diode according to claim 4, in which the heavy metal is gold and/or platinum.

16. A method for producing a high-speed diode comprising the following steps:
provision of a semiconductor body, which has a front side and a rear side arranged opposite to the front side, in which a heavily n-doped zone, a weakly n-doped zone and a weakly p-doped zone are arranged successively proceeding from the rear side in a vertical direction, a pn load junction being formed between the weakly n-doped zone and the weakly p-doped zone, and which has a number of heavily p-doped islands which are arranged at a distance from one another in a lateral direction running perpendicular to the vertical direction and which extend into the weakly p-doped zone proceeding from that side of the weakly p-doped zone which faces the front side,
reduction of the charge carrier lifetime in at least one further zone which is spaced apart from the rear side at least as far as that island from among the heavily p-doped islands which is spaced apart the furthest from the rear side.

17. A method according to claim 16, in which the at least one further zone extends continuously in the lateral direction and essentially over an entire width of the semiconductor body.

18. A method according to claim 16, in which the at least one further zone is arranged exclusively in the weakly p-doped zone.

19. A method according to claim 16, in which the reduction of the charge carrier lifetime is effected by the implantation of particles.

20. A method according to claim 19, in which hydrogen ions and/or helium ions are used as particles.

21. A method according to claim 19, in which the implantation is effected proceeding from the front side of the semiconductor body.

22. A method according to claim 21, in which, during the implantation, a patterned mask is arranged on the front side of the semiconductor body for shielding the heavily p-doped islands.

* * * * *